United States Patent
Kim et al.

(10) Patent No.: US 7,605,655 B2
(45) Date of Patent: Oct. 20, 2009

(54) HIGHLY LINEAR DIFFERENTIAL AMPLIFIER WITH A NOVEL RESISTIVE SOURCE DEGENERATION NETWORK

(75) Inventors: Jongsik Kim, Gyeonggi-do (KR); Sangwon Han, Seoul (KR); Hyunchol Shin, Seoul (KR)

(73) Assignee: Integrant Technologies Inc., Gyeonggi-Do (KR)

( * ) Notice: Subject to any disclaimer, the term of this patent is extended or adjusted under 35 U.S.C. 154(b) by 0 days.

(21) Appl. No.: 12/129,364

(22) Filed: May 29, 2008

(65) Prior Publication Data

US 2009/0219092 A1 Sep. 3, 2009

(30) Foreign Application Priority Data

Feb. 29, 2008 (KR) .................. 10-2008-0018826

(51) Int. Cl.
*H03F 3/45* (2006.01)
(52) U.S. Cl. ................ 330/253; 330/124 R; 330/252
(58) Field of Classification Search ............. 330/253, 330/124 R, 252
See application file for complete search history.

(56) References Cited

U.S. PATENT DOCUMENTS

| | | | | |
|---|---|---|---|---|
| 3,936,731 | A * | 2/1976 | Wheatley, Jr. ............... | 330/255 |
| 5,337,091 | A * | 8/1994 | Harford et al. .............. | 348/737 |
| 6,586,996 | B2 * | 7/2003 | Fanous et al. ............... | 330/254 |
| 6,617,910 | B2 * | 9/2003 | Quan .......................... | 327/359 |
| 6,734,712 | B2 * | 5/2004 | Holdenried et al. ......... | 327/350 |
| 2002/0113650 | A1 | 8/2002 | Kim et al. | |
| 2006/0022740 | A1 | 2/2006 | Kim et al. | |
| 2007/0200631 | A1 | 8/2007 | Kim et al. | |

FOREIGN PATENT DOCUMENTS

| | | |
|---|---|---|
| KR | 10-2002-0067331 | 8/2002 |
| KR | 10-2006-0011742 | 2/2006 |
| KR | 10-2007-0020794 | 2/2007 |

OTHER PUBLICATIONS

V Aparin and L. E. Larson, "Modified Derivative Superposition Method for Linearing FET Low-Noise Amplifiers," IEEE Tran. Microwave Theory and Techniques, vol. 53, No. 2, pp. 571-581, Feb. 2005.
J. Kim et al., "A 2.4-GHz CMOS Driver Amplifier Based on Multiple-Gated Transistor and Resistive Source Degeneration for Mobile WiMax," in Proc. IEEE Asian Solid-State Circuits Conference, Nov. 2006, pp. 255-258.

* cited by examiner

*Primary Examiner*—Patricia Nguyen
(74) *Attorney, Agent, or Firm*—Foley & Lardner LLP

(57) ABSTRACT

There is provided a highly linear differential amplifying circuit. The highly linear differential amplifying circuit includes: a differential amplifying unit including a main differential amplifying unit having a differential pair of transistors for amplifying a difference of two input signals and an auxiliary amplifying unit connected in parallel with the main differential amplifying unit, wherein second-order derivatives of transconductances of the main differential amplifying unit and the auxiliary differential amplifying unit are properly set to have an offset; and a source degeneration resistor unit including a first source degeneration resistor to a fourth source degeneration resistor. Accordingly, the linearity of the differential amplifying circuit is improved at a wide output power region.

6 Claims, 9 Drawing Sheets

FIG. 1

PRIOR ART

FIG. 2

PRIOR ART

FIG. 3

PRIOR ART

HIGHLY LINEAR DIFFERENTIAL AMPLIFIER WITH A NOVEL RESISTIVE SOURCE DEGENERATION NETWORK

RELATED APPLICATIONS

This application claims priority from Korean Patent Application No. 10-2008-0018826, filed Feb. 29, 2008, the disclosure of which is hereby incorporated herein by reference in its entirety as if set forth fully herein.

BACKGROUND OF THE INVENTION

1. Field of the Invention

The present invention relates to a highly linear differential amplifying circuit.

2. Description of the Background Art

These days, amplifiers with high linearity are required in radio communication systems. Among conventional techniques for improving linearity of amplifiers, the multiple-gated transistor (MGTR) technique (Prior art 1, Korean Publication Patent No. 10-2002-0067331) is recognized as one of the effective methods for improving the linearity of a CMOS amplifier. This linearization technique is a technique in which second-order derivative terms of the entire transfer function are removed by controlling main and auxiliary transistors to have a proper size and applying a proper bias voltage to the main and auxiliary transistors, so that a third harmonic element is effectively removed. Based on the MGTR technique, a technique for improving linearity of a differential amplifier (Prior art 2, Korean Publication Patent No. 10-2006-0011742) has been proposed.

In manufacturing an amplifying circuit using such a conventional technique, a bonding wire is inevitably included at a source terminal of the amplifying circuit during the packaging process. The inductance of the bonding wire at the source node is known to become a path for the second harmonic feedback component, and consequently the linearity improvement effect of the original MGTR amplifier rapidly disappears as the operating frequency or the output power grows higher. In order to solve such a problem, a method was proposed to add an additional inductor in the form of a transformer to source terminals of the main and auxiliary transistors and controlling the phase of the second harmonics (Prior art 3, V Aparin and L. E. Larson, "Modified Derivative Superposition Method for Linearizing FET Low-Noise Amplifiers," IEEE Tran. Microwave Theory and Techniques, vol. 53, no. 2, pp. 571-581, February 2005). Meanwhile, a method for improving linearity by adding a degeneration resistor to a source terminal (Prior art 4, J. Kim et. al., "A 2.4-GHz CMOS Driver Amplifier Based on Multiple-Gated Transistor and Resistive Source Degeneration for Mobile WiMAX," in Proc. IEEE Asian Solid-State Circuits Conference, November 2006, pp. 255-258, Prior art 5, Korean Publication Patent No. 10-2007-0020794) was proposed in order to address the second harmonic feedback effect.

However, in the methods disclosed in the Prior arts 1 to 5, the linearity improvement effect is found to be unsatisfactory especially when the operating frequency or the output power grows higher.

This phenomenon is explained in detail below.

As disclosed in the Prior art 3, in accordance with the Prior art 1 for linearizing the main and auxiliary transistors through a proper sizing and biasing, the linearity improvement effect is often found to disappear as the operating frequency or the output power gets higher. This is because a second harmonic component generated by a transistor is fed back through an inductance element at a source terminal of the transistor and mixed with a fundamental frequency component of an input to generate a third-order intermodulation distortion signal, which is generally referred to as a "second harmonic feedback effect."

In order to solve such a problem of the Prior art 1, it is effective to apply a linear feedback technique. Generally, if a linear feedback is applied to an amplifier, the output-referred third-order intercept point (OIP3) of the amplifier is improved by a factor of $(1+T)^{1/2}$ at a low output power region, and also improved by a factor of $(1+T)^{1/4}$ at a high output power region. Here, T denotes a feedback gain.

Figure 1:
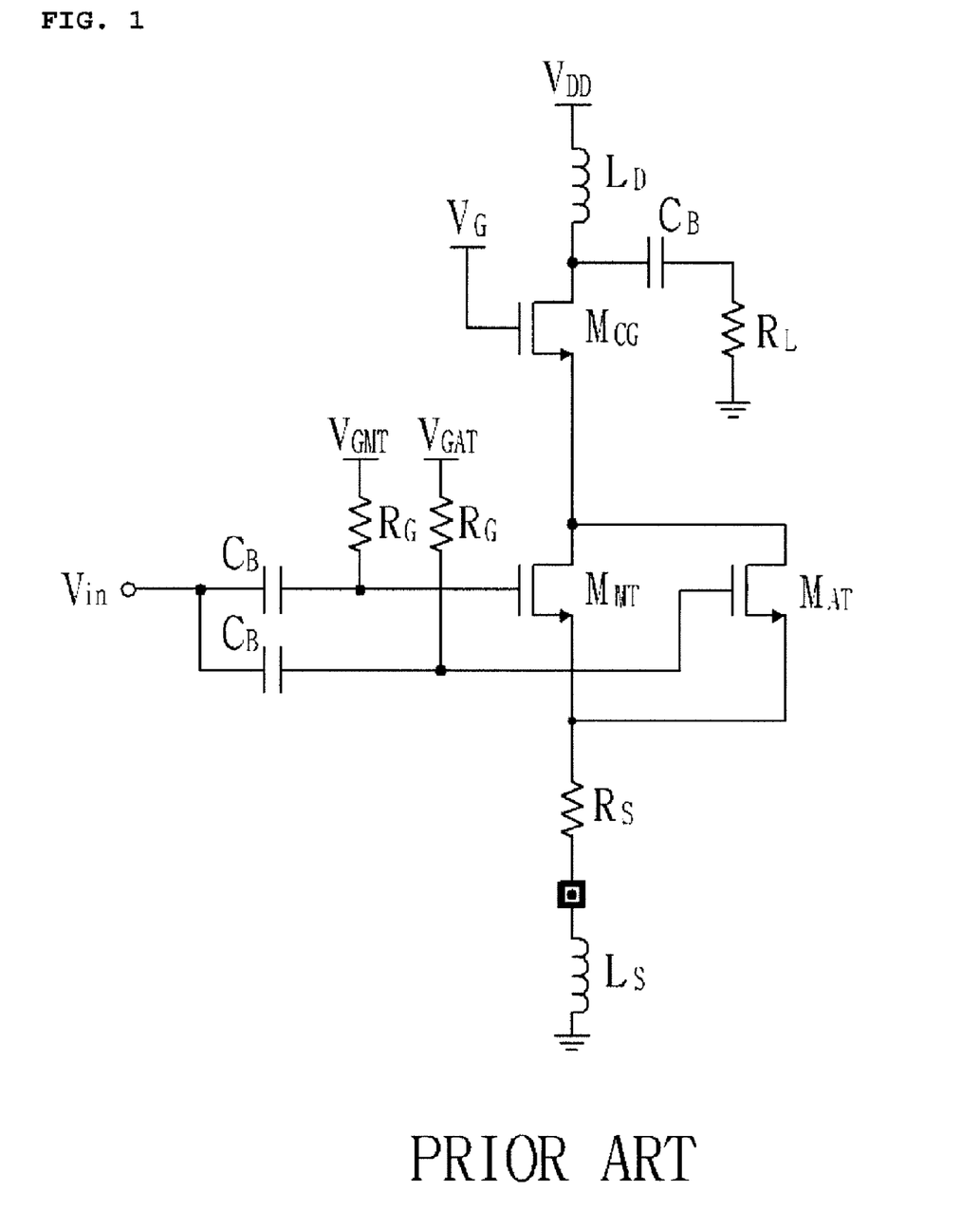
FIG. 1 is a circuit diagram of a conventional single-ended amplifier with a source degeneration resistor.

An example to which such a linear feedback technique is applied is illustrated in FIG. 1.

Referring to FIG. 1, a resistor $R_S$ with small resistance is added to a source terminal of the amplifier and then connected in series to a bonding wire having an inductance element $L_S$ so as to realize the wanted linear feedback. In such a configuration, the OIP3 of the amplifier can be enhanced as disclosed in the Prior arts 4 and 5.

Figure 2:
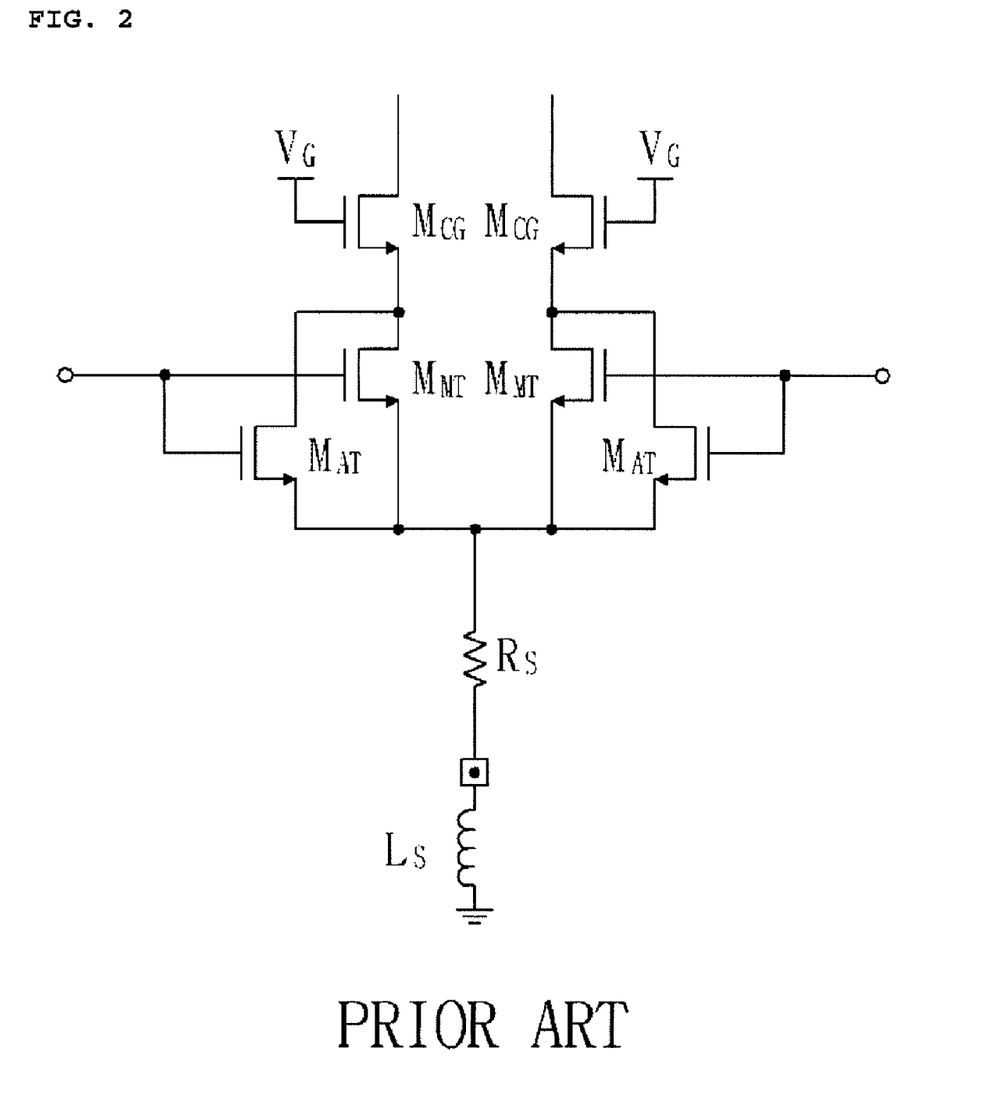
FIGS. 2 and 3 are circuit diagrams of conventional differential amplifying circuits with source degeneration resistors.
Figure 3:
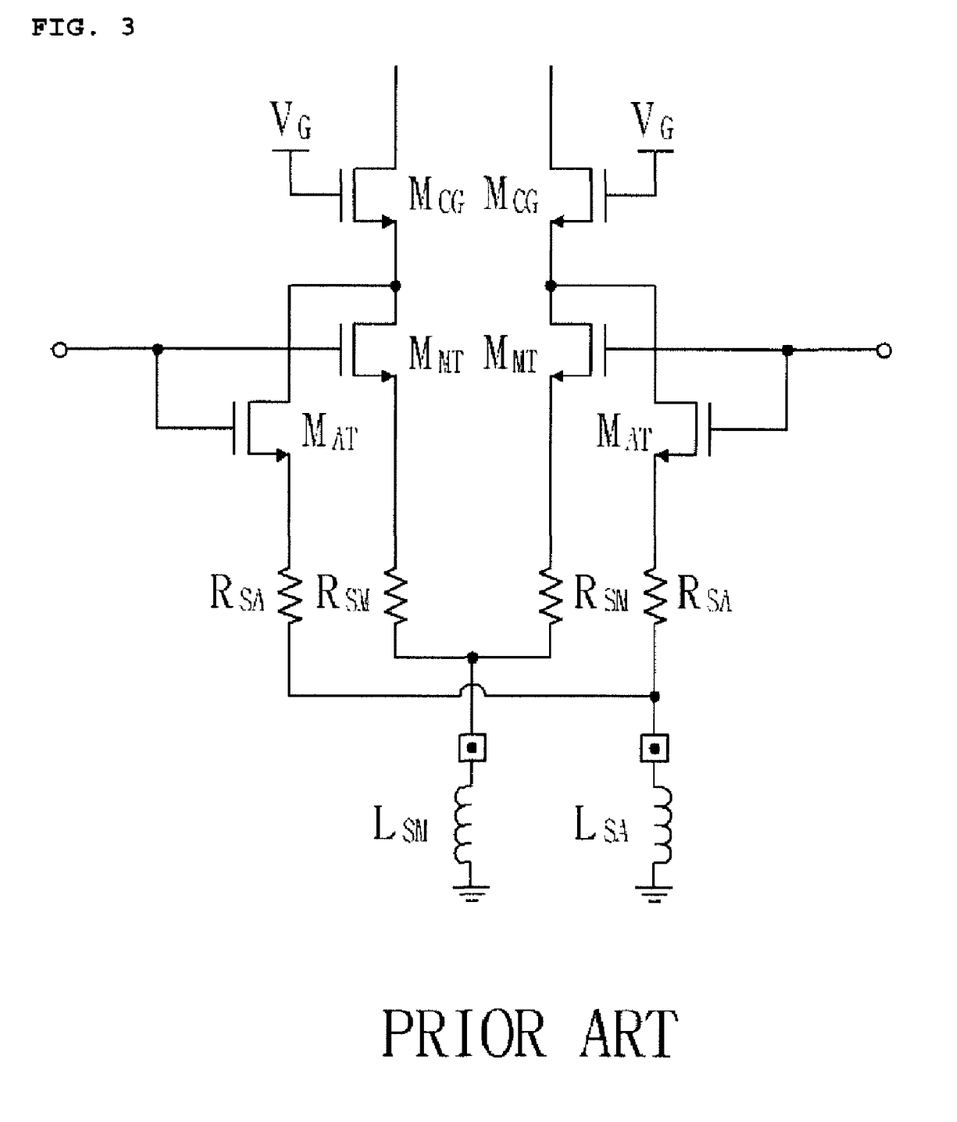

Such a source degeneration resistor technique may be applied to differential amplifier topologies as shown in FIGS. 2 and 3. When a source degeneration resistor is added to a differential amplifier, source degeneration resistors can be completely shared by the differential transistor pair as shown in FIG. 2, or the source degeneration resistors of the main and auxiliary transistors can be completely separated from each other as shown in FIG. 3.

However, such conventional structures have the following problems.

First of all, the structure of FIG. 2 in which $R_S$ and $L_S$ are shared by the main and auxiliary transistors is considerably sensitive to the operating conditions of the main transistor $M_{MT}$ in removing a third-order derivative coefficient (93) of the total transfer function. In this structure, even though the $g_3$ cancellation condition is achieved in DC, the condition is easily disturbed in RF operation because a rather big signal swing fed through the main transistors $M_{MT}$ will appear at the common source node and as a result, disturbs the biasing condition of the auxiliary transistors $M_{AT}$. Therefore, in the structure in which the source degeneration resistor is shared by the main and auxiliary transistors, it is not easy to maintain the improved linearity even under the large signal operation. Also the $g_3$ cancellation condition is sensitive to the process, temperature, and voltage variations in this shared structure, which is not desirable either.

The problems of the shared structure described above may be mitigated by separating the source degeneration resistors. As shown in FIG. 3, the separate structure allows independent optimization of the degeneration resistors $R_{SM}$ and $R_{SA}$ for the main and auxiliary transistors $M_{MT}$ and $M_{AT}$, respectively. Here, the $R_{SM}$ is desirably made small to minimize the gain degradation, while the $R_{SA}$ is desirably made large to effectively perform the second harmonic feedback cancellation. However, another difficulty arises in this structure. When $R_{SA}$ becomes high, it lowers the effective $g_3$ of the auxiliary transistor, and thus makes it difficult to maintain the $g_3$ cancellation condition with a reasonable gate size of the auxiliary transistor. Such a difficulty often leads to an unsatisfactory linearity performance as the output power becomes high.

SUMMARY OF THE INVENTION

Therefore, the present invention is directed to provide a differential amplifying circuit by solving the problems imposed by the conventional structures.

According to an aspect of the present invention, there is provided a highly linear differential amplifying circuit, which includes: a differential amplifying unit including a main differential amplifying unit having a differential pair of transistors for amplifying a difference of two input signals and an auxiliary amplifying unit connected in parallel with the main differential amplifying unit, wherein the second-order derivatives of the transconductances of the main differential amplifying unit and the auxiliary differential amplifying unit are set properly with some offset; and a source degeneration resistor unit including a first source degeneration resistor connected between an external first inductance element and a source of a first main transistor included in the main differential amplifying unit, a second source degeneration resistor connected between an external second inductance element and a source of a second main transistor included in the main differential amplifying unit, a third source degeneration resistor connected between the common source node of the first and second auxiliary transistors included in the auxiliary differential amplifying unit and the first source degeneration resistor, and a fourth source degeneration resistor connected between the common source node of the first and second auxiliary transistors included in the auxiliary differential amplifying unit and the second source degeneration resistor.

Preferably, the differential amplifying unit further includes a first common degeneration resistor connected between the first source degeneration resistor and the first inductance element; and a second common degeneration resistor connected between the second source degeneration resistor and the second inductance element.

Preferably, the differential amplifying unit further includes a cascode-type transistor unit connected between the differential amplifying unit and an output terminal to increase output impedance and isolation.

Preferably, an output power region, at which the linearity is maximally improved, is controlled by adjusting the resistance of each of the third and fourth source degeneration resistors.

Preferably, the external inductance elements are bonding wires.

Preferably, the second-order derivative of the transconductance of the main differential amplifying unit has a negative value, the second-order derivative of the transconductance of the auxiliary differential amplifying unit has a positive value, and the second-order derivative of the entire transconductance of the main differential amplifying unit and the auxiliary differential amplifying unit are adequately cancelled out to have a value of zero.

The present invention relates to the structure of a differential amplifying circuit for obtaining high linearity at relatively high output power in RF amplifiers that can be used in RF transceiver integrated circuits, and the like. More specifically, a newly proposed resistive source degeneration structure is applied to the conventional differential MGTR amplifier structure, so that a differential amplifying circuit with more effective linearity improvement is proposed.

According to the present invention, the linearity of a differential amplifying circuit can be improved at high operating frequency and wide output power region.

BRIEF DESCRIPTION OF THE DRAWINGS

The above and other features and advantages of the present invention will become more apparent to those of ordinary skill in the art by describing in detail preferred embodiments thereof with reference to the attached drawings in which.

DETAILED DESCRIPTION OF PREFERRED EMBODIMENT

Hereinafter, preferred embodiments of the present invention will be described in detail with reference to the accompanying drawings.

Figure 4:
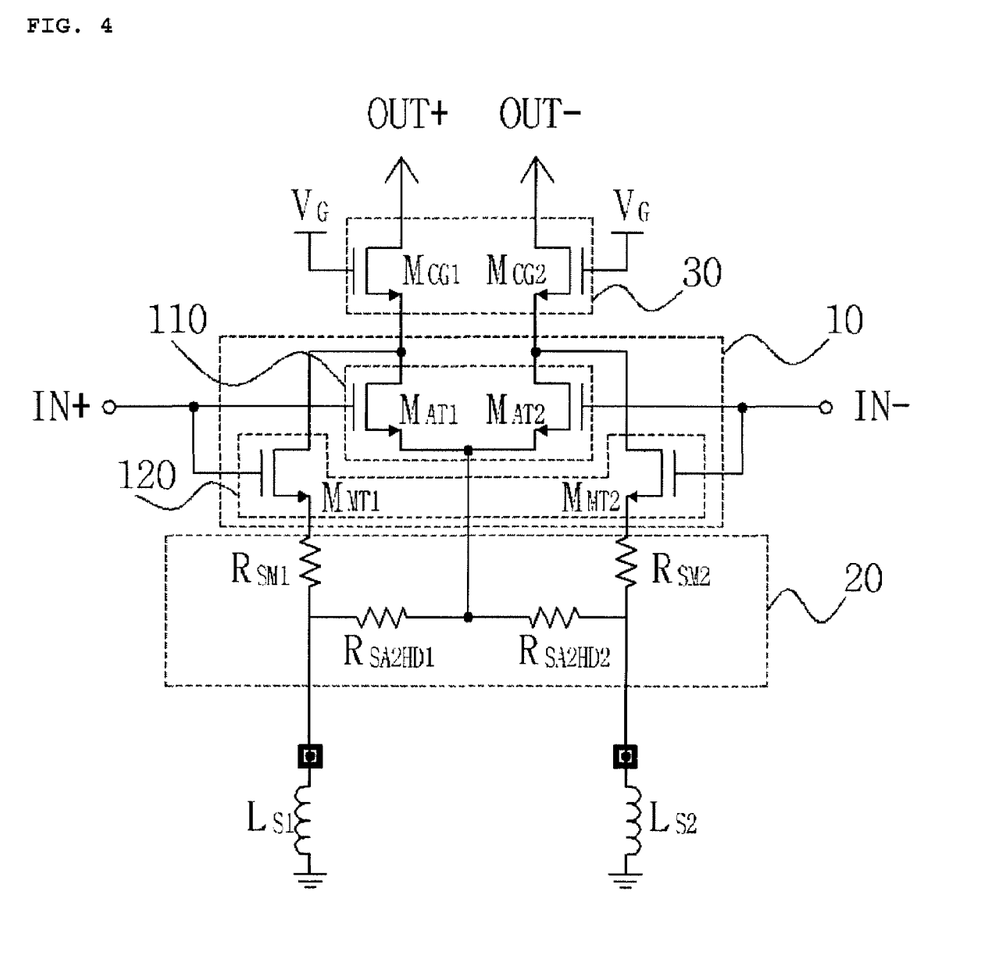
FIG. 4 is a circuit diagram of a highly linear differential amplifying circuit according to a first embodiment of the present invention.

FIG. 4 is a circuit diagram of a highly linear differential amplifying circuit according to a first embodiment of the present invention.

The highly linear differential amplifying circuit according to the first embodiment of the present invention has a structure suitable for solving problems described in the aforementioned conventional structures of FIGS. 2 and 3 and effectively linearizing the amplifying circuit across a relatively wide output power range.

Referring to FIG. 4, the highly linear differential amplifying circuit according to the first embodiment of the present invention includes a differential amplifying unit 10 and a source degeneration resistor unit 20.

The differential amplifying unit 10 includes a main differential amplifying unit 120 and an auxiliary differential amplifying unit 110. The main differential amplifying unit 120 has a differential pair of transistors to amplify a difference of two input signals. The auxiliary differential amplifying unit 110 is connected in parallel with the main differential amplifying unit 120, and the second-order derivatives of transconductances of the main differential amplifying unit 120 and the auxiliary differential amplifying unit 110 are properly set to have some offset. Preferably, the second-order derivative of the transconductance of the main differential amplifying unit 120 has a negative value, the second-order derivative of the transconductance of the auxiliary differential amplifying unit 110 has a positive value, and the second-order derivative of the entire transconductance of the main and auxiliary differential amplifying units are completely cancelled out to have a value of zero.

The source degeneration resistor unit 20 includes first to fourth source degeneration resistors $R_{SM1}$, $R_{SM2}$, $R_{SA2HD1}$ and $R_{SA2HD2}$. The first source degeneration resistor $R_{SM1}$ is connected between an external first inductance element $L_{S1}$ and a source of a first main transistor $M_{MT1}$ included in the main differential amplifying unit 120. The second source degeneration resistor $R_{SM2}$ is connected between an external second inductance element $L_{S2}$ and a source of a second main transistor $M_{MT2}$ included in the main differential amplifying unit 120. The third source degeneration resistor $R_{SA2HD1}$ is connected between a common connection terminal of sources of the first and second auxiliary transistors $M_{AT1}$ and $M_{AT2}$ included in the auxiliary differential amplifying unit 110 and the first source degeneration resistor $R_{SM1}$. The fourth source degeneration resistor $R_{SA2HD2}$ is connected between the common connection terminal of the sources of the first and second auxiliary transistors $M_{AT1}$ and $M_{AT2}$ and the second source degeneration resistor $R_{SM2}$.

Hereinafter, the structure and function of the highly linear differential amplifying circuit according to the first embodiment of the present invention will be described in detail.

The source degeneration resistors of the main transistors are separately connected to the left and right main transistors of the differential pair. More specifically, the first source degeneration resistor $R_{SM1}$, which is a source degeneration resistor of the first main transistor $M_{MT1}$, is separated from the second main transistor $M_{MT2}$ and connected to the source of the first main transistor $M_{MT1}$, and the second source degeneration resistor $R_{SM2}$, which is a source degeneration resistor of the second main transistor $M_{MT2}$, is separated from the first main transistor $M_{MT1}$ and connected to the source of the second main transistor $M_{MT2}$.

The source degeneration resistors of the auxiliary transistors are not directly connected to the sources of the auxiliary transistors. Instead, after the sources of the auxiliary transistors are connected together, the source degeneration resistors of the auxiliary transistors are connected to the common source node of the auxiliary transistors and separately connected to the source degeneration resistors of the left and right main transistors. More specifically, one terminal of the third source degeneration resistor $R_{SA2HD1}$, which is a source degeneration resistor of the first auxiliary transistor $M_{AT1}$, is connected to a node at which the sources of the first and second auxiliary transistors $M_{AT1}$ and $M_{AT2}$ are commonly connected, and the other terminal of the third source degeneration resistor $R_{SA2HD1}$ is connected to the first source degeneration resistor $R_{SM1}$. One terminal of the fourth source degeneration resistor $R_{SA2HE2}$, which is a source degeneration resistor of the second auxiliary transistor $M_{AT2}$, is connected to the node at which the sources of the first and second auxiliary transistors $M_{AT1}$ and $M_{AT2}$ are commonly connected, and the other terminal of the fourth source degeneration resistor $R_{SA2HD2}$ is connected to the second source degeneration resistor $R_{SM2}$. Through such a structure, the source degeneration resistors of the main transistors are separately connected to the main differential transistor pair, and the source degeneration resistors of the auxiliary transistors are commonly connected to the auxiliary differential transistor pair.

Accordingly, it is possible to obtain a structure in which the source degeneration resistors of the main transistors are totally separated but the source degeneration resistors of the auxiliary transistors are shared by the auxiliary transistor pair.

Meanwhile, a second embodiment may be implemented by adding common degeneration resistors shared by the main and auxiliary transistors in the highly linear differential amplifying circuit according to the first embodiment of the present invention. Such a second embodiment is illustrated in FIG. 5.

Figure 5:
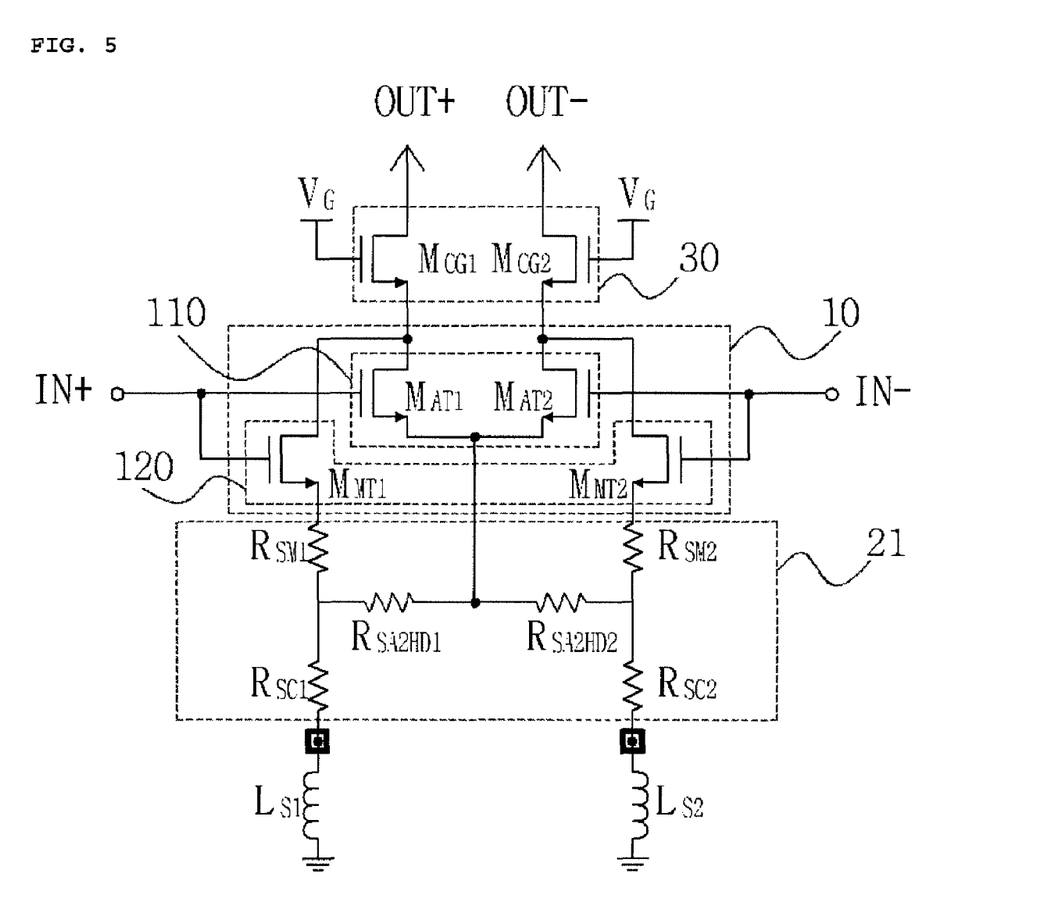
FIG. 5 is a circuit diagram of a highly linear differential amplifying circuit according to a second embodiment of the present invention.

Referring to FIG. 5, a first common degeneration resistor $R_{SC1}$ is connected between the first source degeneration resistor $R_{SM1}$ and the first inductance element $L_{S1}$, and a second common degeneration resistor $R_{SC2}$ is connected between the second source degeneration resistor $R_{SM2}$ and the second inductance element $L_{S2}$. Through such a structure, the first main transistor $M_{MT1}$ and the first auxiliary transistor $M_{AT1}$ share the first common degeneration resistor $R_{SC1}$, and the second main transistor $M_{MT2}$ and the second auxiliary transistor $M_{AT2}$ share the second common degeneration resistor $R_{SC2}$. Accordingly, the linearity of the differential amplifying circuit can be improved further.

Hereinafter, the advantages of the highly linear differential amplifying circuits having a source degeneration structure according to the embodiments of the present invention will be described.

In order to maintain high linearity at relatively high output power, a second harmonic feedback component should be maximally suppressed. Generally, it is known that according to the Taylor series expansion coefficients of the transconductance and the gate-source capacitance of a transistor, the second-order coefficients is greater in a weak inversion region than in a strong inversion region. Thus, it can be anticipated that a second harmonic component created by an auxiliary transistor that operates in a weak inversion region is much stronger than a second harmonic component created by a main transistor. Therefore, much stronger degeneration is required by the auxiliary transistors than the main transistors. With such a strong degeneration, however, the second-order derivative of the transconductance of the auxiliary transistor pair should not be influenced significantly. The structure of FIG. 4 attains the aforementioned advantages. The source degeneration resistors of the auxiliary transistors serve for a large attenuation of the second harmonic signal, while not imposing noticeable influence on the fundamental and odd harmonic signals. It is because the second harmonic signal flows in a common mode in the differential pair while the fundamental and odd harmonic signals flow in a differential mode in the differential pair. Meanwhile, the phases of the second harmonic signals in the main and auxiliary transistors are hard to be matched in the separated structure of degeneration resistors shown in FIG. 3, which inhibits easy cancellation of the second harmonic feedback effect in the conventional structure. By contrast, in the structure of FIG. 4 according to the first embodiment of the present invention, the phases of the second harmonic signals are naturally matched at contact points of the source degeneration resistors of the main and auxiliary transistors, and therefore, the second harmonic signals can be effectively suppressed.

Figure 6:
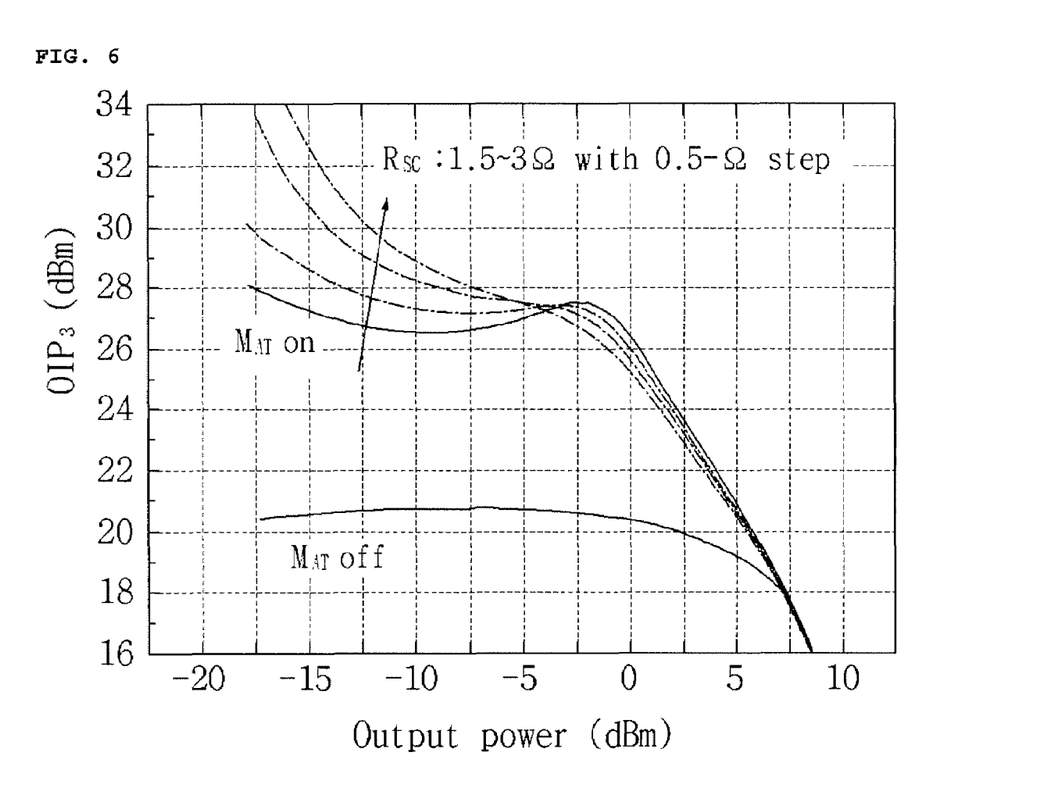
FIGS. 6 to 8 are simulation results that show the effects of the degeneration resistors on the linearity performance according to embodiments of the present invention.
Figure 7:
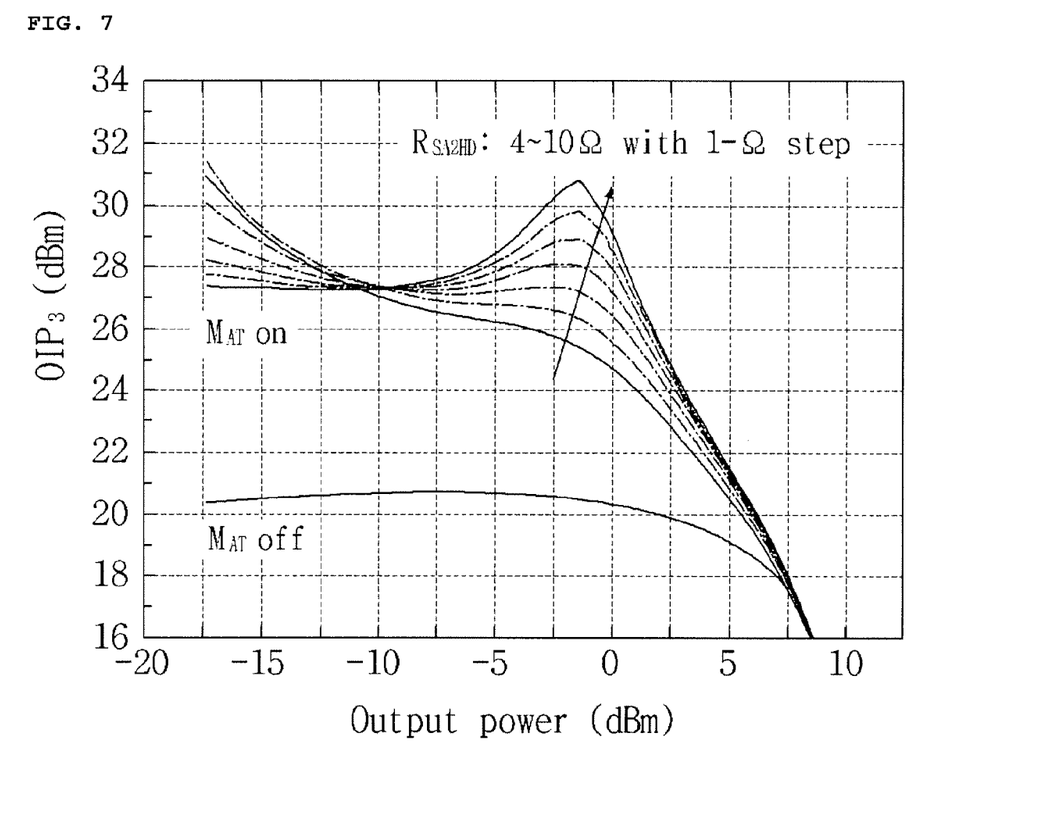

FIGS. 6 and 7 shows simulation results of the output-referred third-order intercept point ($OIP_3$) in the differential amplifying circuit with respect to each of the source degeneration resistors $R_{SC}$ and $R_{SA2HD}$ according to the embodiments of the present invention.

Here, the $OIP_3$ of the differential amplifying circuit is a value computed by using the following Equation 1 based on each IMD3 component value ($P_{IMD3}$) at each output power $P_{out}$.

$$OIP_3 = P_{out} + P_{IMD3}/2 \text{ (dBm)} \tag{1}$$

Generally, the $OIP_3$ of an amplifier is determined by extrapolating the fundamental output power and the third-order intermodulation (IMD3) component characteristics at a low power region. Since the IMD3 component grows three times faster than the fundamental output power, the $OIP_3$ of an amplifier is given by a single value. In practice, however, as the output power grows higher, the IMD3 curve is deviated from the linear relationship. Thus, it is not sufficient to characterize the linearity of an amplifier in high power region only by using a single value of OIP3. Therefore, in the present description, the value of the IMD3 component at each output power is converted into a corresponding $OIP_3$ value by using the well known Equation 1. By doing so, all behaviors of the amplifier's linearity can be characterized across the whole region of the output power.

Referring to FIG. 6, the $R_{SC}$ mostly improve $OIP_3$ at a low output power region, but hardly has influence on $OIP_3$ at a high output power region. Similar effects have also been observed in the conventional structures of FIGS. 2 and 3. On the other hand, referring to FIG. 7, it can be seen that $OIP_3$ at a relatively high output power region is remarkably improved by adjusting the $R_{SA2HD}$, which is a unique effect exhibited in the structure of the present invention. Although the $OIP_3$ at a relative low output power region may not be improved or sometimes slightly degraded by adjusting the $R_{SA2HD}$, the improved $OIP_3$ at a relative high output power region is considered more desirable.

In a general driver amplifier or a power amplifier that are used in an RF transmitter, linearity requirement is more stringent at a high output power region than at a low output power region. Therefore, the structure of the present invention, in which the source degeneration resistors are partially shared, is suitable for applications of a driving amplifier, power amplifier or the like, which should provide excellent linearity at high output power.

Figure 8:
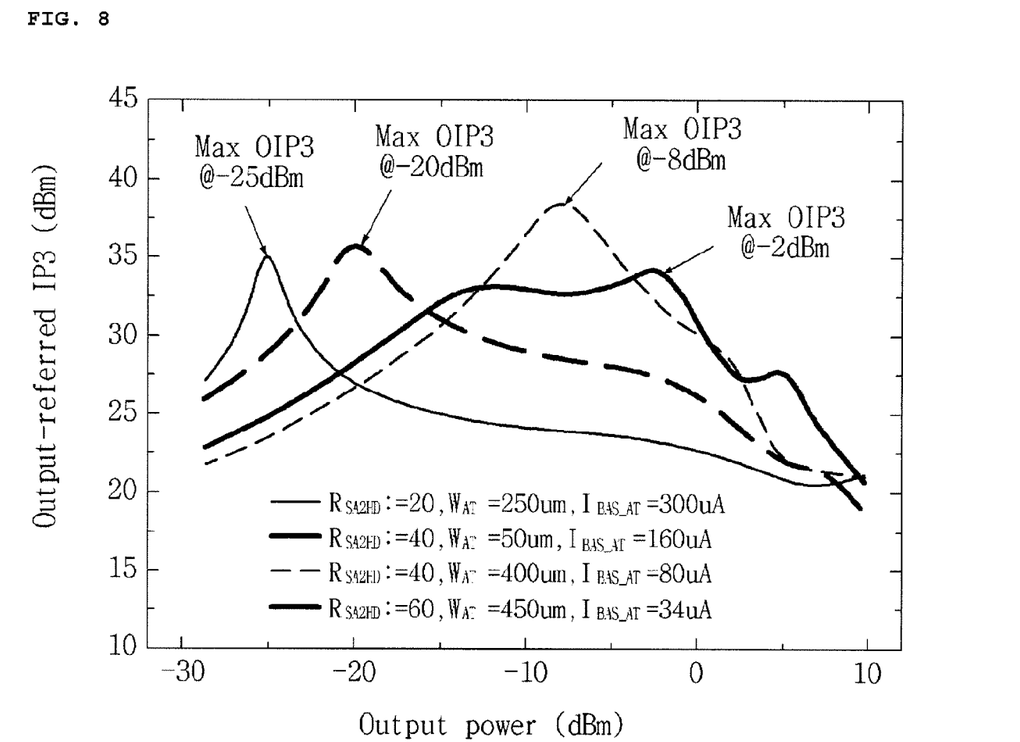

FIG. 8 is another simulation result showing an effect according to the present invention.

Referring to FIG. 8, an output power region, at which the linearity is maximally improved, can be adjusted by appropriately controlling the $R_{SA2HD}$, the gate width of an auxiliary transistor, and a bias condition applied to the auxiliary transistor. This implies that the output power level at which the peak linearity is obtained, can be adjusted by controlling the $R_{SA2HD}$ depending on the required applications needs. It is considered a unique effect demonstrated in the structure of the present invention.

In order to verify the structure of the present invention, a differential driving amplifier that operates at 2.4 GHz and has a structure in which the source degeneration resistors are partially shared as shown in FIG. 5 is manufactured using a 0.18-μm RF CMOS technology. A cascode transistor unit is added to increase the isolation and the output impedance. The size of a main transistor is 0.18×320 μm, the size of an auxiliary transistor is 0.18×96 μm, and the size of a transistor used in the cascode transistor unit is 0.18×576 μm. In order to cancel the $g_3$ and minimize a second harmonic feedback component, the sizes of $R_{SM}$, $R_{SC}$ and $R_{SA2HD}$ are chosen to be 2 ohms, 2 ohms and 6 ohms, respectively. The designed driving amplifier consumes 30 mA from a power supply of 1.8 V, and the power gain of the driving amplifier is 9.8 dB.

With two tone inputs applied, the maximum OIP3 is measured at +25.8 dBm at an output power of −9 dBm. As the output power increases up to +5 dBm, the OIP3 is measured to be maintained higher than +20.5 dBm.

Figure 9:
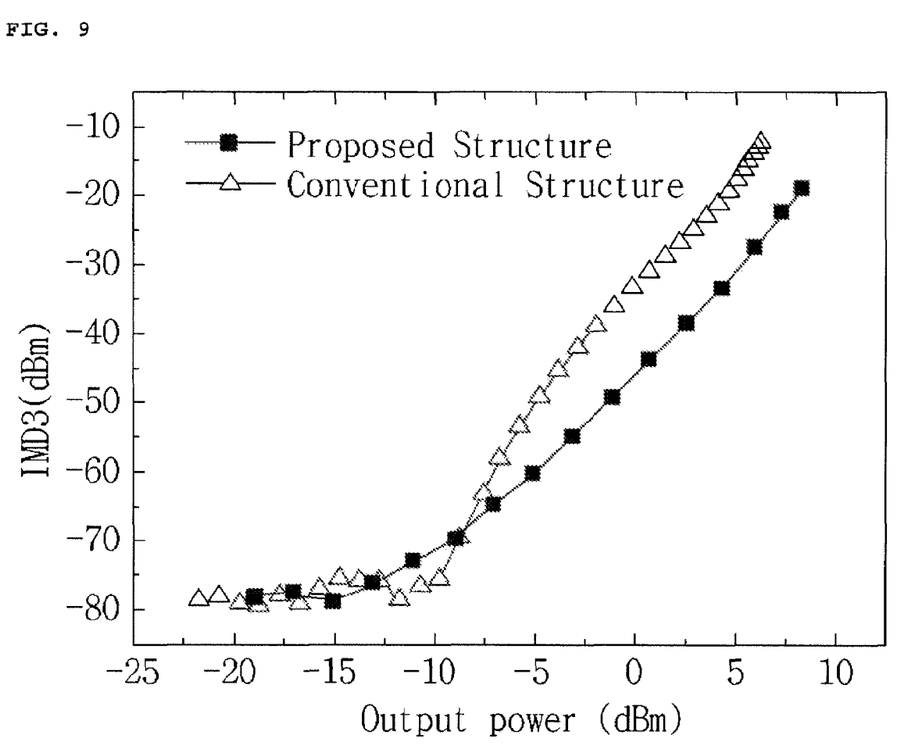
FIG. 9 is a graph showing measurement results of the highly linear differential amplifying circuit manufactured according to the second embodiment of the present invention and the conventional differential amplifying circuit manufactured according to the embodiment of the conventional structure of FIG. 3.

FIG. 9 is a graph that compares the measured results of IMD3 components of two amplifiers, of which the conventional amplifier employs the conventional source degeneration structure as shown in FIG. 3 and the proposed amplifier employs the proposed degeneration structure as shown in FIG. 5. From the measurement results, it can be seen that the structure of the present invention in FIG. 5 shows more improved linearity at a broader and higher output power range as compared with the conventional structure.

While the present invention has been particularly shown and described with reference to exemplary embodiments thereof, it will be understood by those of ordinary skill in the art that various changes in form and details may be made therein without departing from the spirit and scope of the present invention as defined by the following claims. Therefore, the scope of the present invention should be understood within the scope of the present invention defined by the appended claims.

What is claimed is:

1. A highly linear differential amplifying circuit, comprising:
a differential amplifying unit including a main differential amplifying unit having a differential pair of transistors for amplifying a difference of two input signals and an auxiliary amplifying unit connected in parallel with the main differential amplifying unit, wherein the second-order derivatives of transconductances of the main differential amplifying unit and the auxiliary differential amplifying unit are properly set to have some offset; and
a source degeneration resistor unit including a first source degeneration resistor connected between an external first inductance element and a source of a first main transistor included in the main differential amplifying unit, a second source degeneration resistor connected between an external second inductance element and a source of a second main transistor included in the main differential amplifying unit, a third source degeneration resistor connected between a common connection terminal of sources of the first and second auxiliary transistors included in the auxiliary differential amplifying unit and the first source degeneration resistor, and a fourth source degeneration resistor connected between the common connection terminal of the sources of the first and second auxiliary transistors and the second source degeneration resistor.

2. The differential amplifying circuit of claim 1, further comprising:
a first common degeneration resistor connected between the first source degeneration resistor and the first inductance element; and
a second common degeneration resistor connected between the second source degeneration resistor and the second inductance element.

3. The differential amplifying circuit of claim 1, further comprising a cascode transistor unit connected between the differential amplifying unit and an output terminal to increase output impedance and isolation.

4. The differential amplifying circuit of claim 1, wherein an output power region, at which the improvement of linearity is maximized, is controlled by adjusting the resistance of each of the third and fourth source degeneration resistors.

5. The differential amplifying circuit of claim 1, wherein the external inductance elements are bonding wires.

6. The differential amplifying circuit of claim 1, wherein the second-order derivative of the transconductance of the main differential amplifying unit has a negative value, the second-order derivative of the transconductance of the auxiliary differential amplifying unit has a positive value, and the second-order derivative of the entire transconductance of the main differential amplifying unit and the auxiliary differential amplifying unit are completely cancelled out to have a value of zero.

* * * * *